United States Patent [19]

McGuire

[11] Patent Number: 4,626,980
[45] Date of Patent: Dec. 2, 1986

[54] POWER BRIDGE HAVING A NON-DISSIPATIVE SNUBBER CIRCUIT

[75] Inventor: Thomas B. McGuire, San Diego, Calif.

[73] Assignee: Square D Company, Palatine, Ill.

[21] Appl. No.: 611,242

[22] Filed: May 17, 1984

[51] Int. Cl.⁴ ............................................. H02M 7/537
[52] U.S. Cl. ........................................ 363/56; 363/132
[58] Field of Search ........................ 363/17, 55, 56, 58, 363/97, 98, 132, 133

[56] References Cited

U.S. PATENT DOCUMENTS

| | | | |
|---|---|---|---|
| 3,729,655 | 4/1973 | Gratzke | 321/14 |
| 3,750,003 | 7/1973 | Petersen et al. | 321/12 |
| 4,015,185 | 3/1977 | Pollmeier | 321/44 |
| 4,016,482 | 4/1977 | Cielo et al. | 323/17 |
| 4,063,306 | 12/1977 | Perkins et al. | 363/98 |
| 4,167,776 | 9/1979 | Nygaard | 363/56 |
| 4,276,588 | 6/1981 | McLyman et al. | 363/56 |
| 4,334,254 | 6/1982 | Baker et al. | 363/133 |
| 4,336,587 | 6/1982 | Boettcher, Jr. et al. | 363/56 |
| 4,370,701 | 1/1983 | Western | 363/56 |
| 4,403,269 | 9/1983 | Carroll | 361/91 |
| 4,432,032 | 2/1984 | Baker et al. | 363/132 |
| 4,488,058 | 12/1984 | Cheffer | 307/66 |

Primary Examiner—Patrick R. Salce
Assistant Examiner—D. L. Rebsch
Attorney, Agent, or Firm—Larry I. Golden; Richard T. Guttman

[57] ABSTRACT

A non-dissipative snubber circuit for use in a power bridge circuit having a pair of switching power transistors for controllably coupling pulses of electrical current in opposite directions through the primary winding of a power transformer, to generate a 60 hertz ac power signal. The snubber circuit includes a separate snubber capacitor shunting each transistor, with the current flowing through the transformer's primary winding being diverted to charge one of the snubber capacitors each time the associated transistor is switched off. When the transistor is again switched on, the capacitor is reinitialized by discharging it through an inductor. In a half-bridge configuration, the discharge current is directed to a fixed reference node at the opposite side of the transformer's primary winding, whereas in a full-bridge configuration, the discharge current is used to discharge a separate snubber capacitor shunting one of two additional switching power transistors connected to the opposite side of the primary winding.

14 Claims, 3 Drawing Figures

Fig. 2
(A) 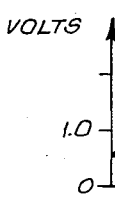
(B) 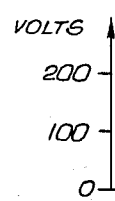
(C) 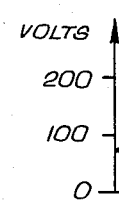
(D) 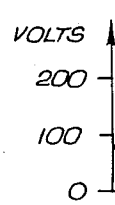
(E) 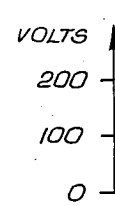
(F) 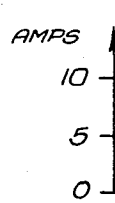

POWER BRIDGE HAVING A NON-DISSIPATIVE SNUBBER CIRCUIT

BACKGROUND OF THE INVENTION

This invention relates generally to power bridge circuits, and, more particularly, to non-dissipative snubber circuits suitable for use in such bridge circuits.

Power bridge circuits are commonly used as power inverters for converting dc power into ac power. In such inverters, two switching power transistors are connected to the primary winding of a power transformer and arranged such that one couples electrical current through the winding in a first direction and the other couples electrical current through the winding in a second, opposite direction. Driver means controllably switches on and off the two transistors in a prescribed sequence and at prescribed duty cycles, to produce a pulse sequence at the transformer's primary winding. This sequence is low-pass filtered to produce the desired ac power signal. In a half-bridge configuration, the side of the transformer's primary winding opposite the two transistors is connected directly to a fixed voltage, whereas in a full-bridge configuration, the primary winding's opposite side is connected to an additional pair of transistors, which cooperate with the first two transistors to couple current through the winding in the two opposite directions.

A snubber circuit is commonly used with each transistor in bridge circuits of this kind, to prevent the simultaneous presence of high voltage and high current in the transistor junction each time it is biased off. This condition of high voltage and high current arises because the load imposed on the transistor by the transformer's primary winding is highly inductive, and the load current therefore continues to flow, even after the transistor has been biased off. The snubber circuit serves as a bypass route for this current, avoiding the transistor junction.

Snubber circuits of this kind typically include a series diode and capacitor shunting each transistor. When the transistor is biased on, the diode ensures that the capacitor does not affect the transistor's operation. When the transistor is first biased off, however, the current that previously flowed through the transistor and that continues to flow because of the load's inductance, is diverted through the diode to charge the capacitor to a predetermined voltage. Thereafter, when the transistor is again turned on, a special circuit diacharges the capacitor to its original state. This discharge circuit frequently takes the form of a resistor connected in parallel with the diode, such that the discharge current is routed through the resistor and transistor. One important drawback to such a circuit configuration is that it can dissipate substantial amounts of energy. Moreover, this energy dissipation cannot ordinarily be reduced without increasing the snubber circuit's recovery time.

Snubber circuits that are non-dissipative of significant amounts of energy have been devised for use in some situations. These circuits typically include an inductor that resonates with the snubber capacitor, to discharge it in a relatively short time duration, with little energy dissipation. Although these prior non-dissipative snubber circuits have proven generally satisfactory for their limited purposes, they are believed to be inherently incompatible with power bridge circuits. Moreover, there is no readily apparent way that these snubber circuits can be modified to make them compatible.

It should therefore be appreciated that there is a need for a snubber circuit that dissipates very little energy, has a rapid recovery time, and is particularly suited for use in a power bridge circuit configuration. The present invention fulfills this need.

SUMMARY OF THE INVENTION

The present invention is embodied in a non-dissipative snubber circuit for particular use in a power bridge circuit that drives an inductive load. The snubber circuit is suitable for use in both half and full bridge configurations. In either case, the bridge circuit includes first and second switching power transistors connected to the same inductive load, with the two transistors being arranged to couple electrical current in opposite directions through the load. Driver means are included for controllably switching on the two transistors at independent, non-simultaneous times. The bridge circuit includes two snubber circuits, each associated with a separate one of the two power transistors. Each snubber circuit includes a separate capacitor shunting its associated transistor, such that when the transistor is switched off by the driver means, current flowing through the inductive load is diverted through the capacitor, to charge it to a predetermined voltage. This protects the transistor from possible damage due to the simultaneous presence of a high voltage and high current in its junction.

In accordance with the invention, the snubber circuits further include first and second non-dissipative discharge means associated with the two respective capacitors, each discharge means discharging the associated capacitor to its original state when the associated transistor is switched on by the driver means. Each such discharge means includes a series-connected inductor and switch means, along with actuation means for controllably actuating the switch means when the associated transistor is switched on, to discharge the capacitor through the inductor. This configuration effectively discharges the capacitor in a rapid fashion, without any substantial dissipation of energy.

In a half-bridge circuit configuration, the side of the inductive load opposite the first and second transistors is maintained at a substantially constant voltage, and the first and second discharge means both connect their respective associated capacitors with that constant voltage.

In a full-bridge circuit configuration, on the other hand, the circuit further includes third and fourth switching power transistors connected to the side of the inductive load opposite the first and second transistors. In this configuration, the third transistor is arranged to cooperate with the first transistor in coupling current through the load in one direction, and the fourth transistor is arranged to cooperate with the second transistor in coupling current through the load in the opposite direction. The driver means controllably switches on and off the first and third transistors at substantially the same times and the second and fourth transistors at substantially the same times. The snubber circuit further includes third and fourth capacitors shunting the respective third and fourth transistors, each such capacitor receiving a charging current when the associated transistor is switched off by the driver means. The first discharge means interconnects the first and third capacitors, to simultaneously discharge both of them to their original states when the associated transistors are again switched on by the driver means. Similarly, the second discharge means interconnects the second and fourth capacitors, to simultaneously discharge them when their corresponding transistors are again switched on by the driver means. The respective pairs of capacitors preferably have substantially equal capacitance values.

In another aspect of the invention, the actuation means included in each of the first and second discharge means includes a transformer and means for coupling a predetermined drive signal to the transformer's primary winding when the associated power transistor is switched off by the driver means. The transformer's secondary winding is connected to the switch means. When the power transistor is again switched on and the drive signal therefore uncoupled from the transformer's primary winding, the magnetic field stored in the transformer collapses, to actuate the switch means for a predetermined time duration. This predetermined time duration preferably corresponds to about one-half the natural period of the associated inductor and capacitor(s).

Other aspects and advantages of the present invention will become apparent from the following description of the preferred embodiments, taken in conjunction with the accompanying drawings, which illustrate, by way of example, the principles of the invention.

BRIEF DESCRIPTION OF THE DRAWINGS

FIGS. 2(A)-(F) depict several waveforms present in the half-bridge circuit of FIG. 1.

DESCRIPTION OF THE PREFERRED EMBODIMENT

Figure 3:
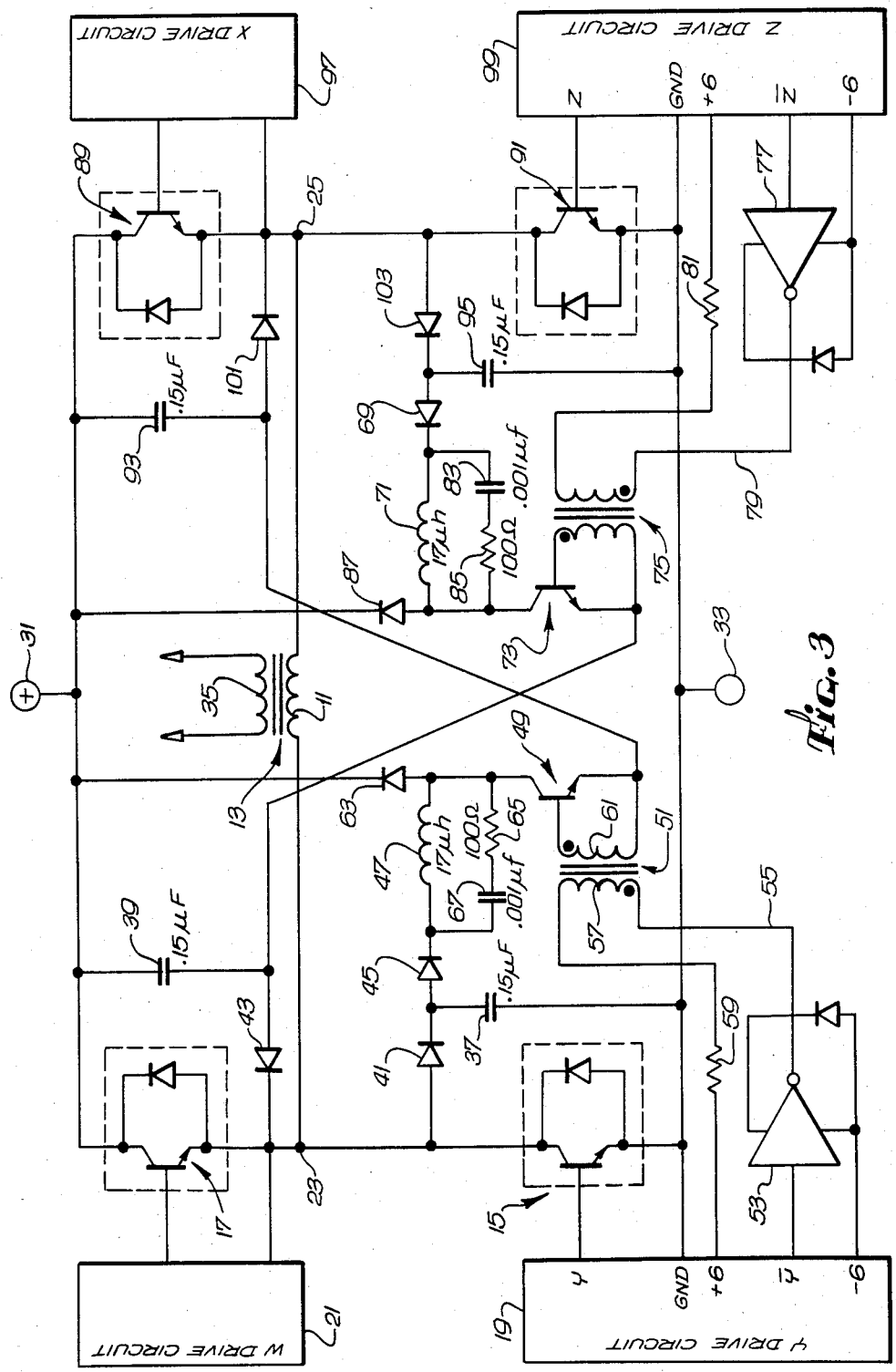
FIG. 3 is a schematic circuit diagram of a full power bridge circuit that includes an alternative embodiment of the non-dissipative snubber circuit of the invention.

As shown in the accompanying drawings, the invention is embodied in a special snubber circuit for use in either a half power bridge (FIG. 1) or a full power bridge (FIG. 3). In both cases, pulses of electrical current are coupled through the primary winding 11 of a power transformer 13, to generate, after appropriate filtering, a 60 Hz ac power signal. The half and full power bridges both include snubber circuits for protecting their switching power transistors from damage each time they are turned off, by diverting electrical current from the transistor junctions and thereby preventing the simultaneous presence of both high current and high voltage in the junctions.

Figure 1:
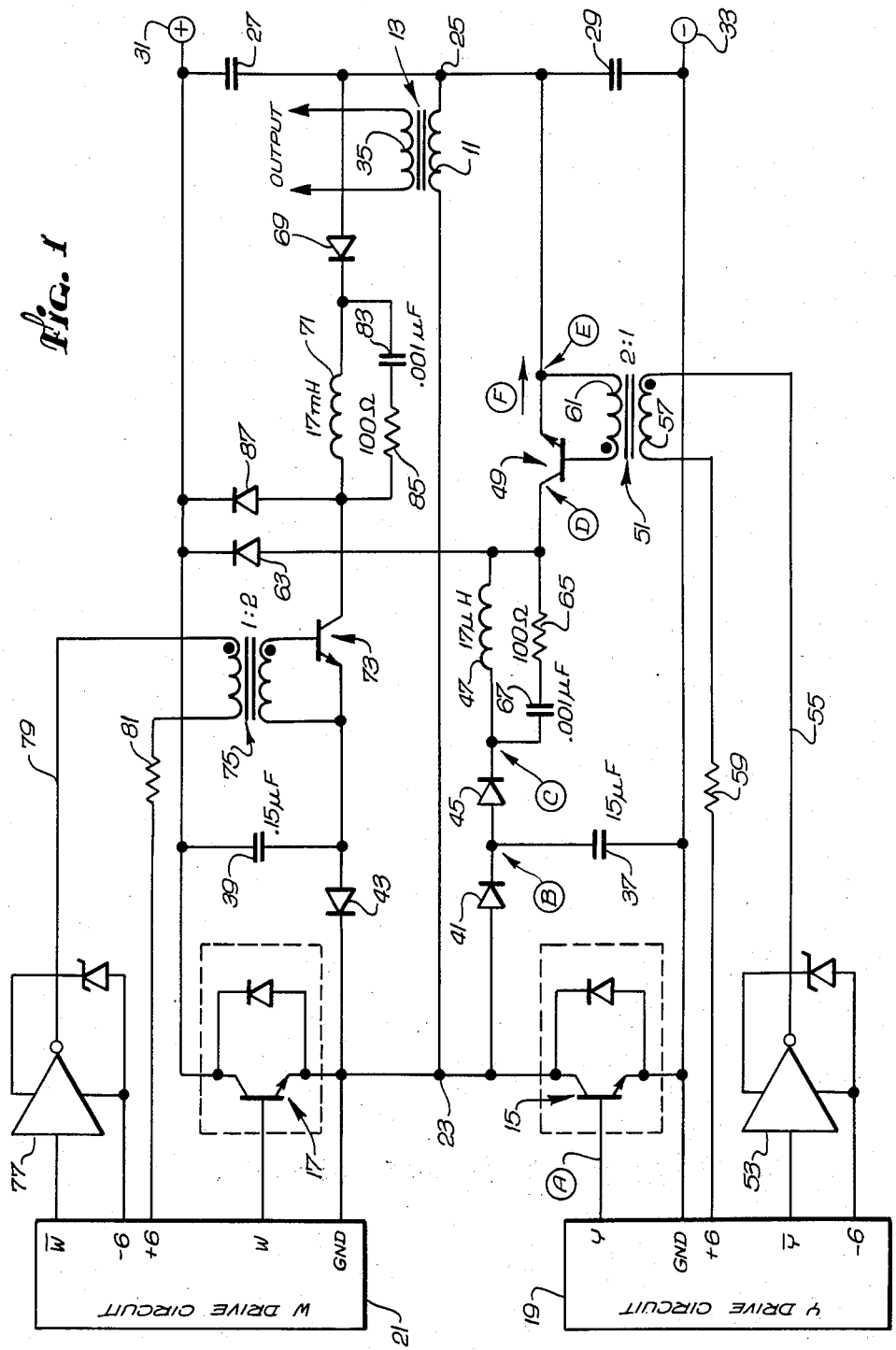
FIG. 1 is a schematic circuit diagram of a half power bridge circuit that includes one embodiment of the non-dissipative snubber circuit of the invention.

As shown in FIG. 1, the half power bridge circuit includes two npn switching power transistors 15 and 17, whose base terminals are driven by W and Y drive circuits 19 and 21, respectively. The two transistors, are both connected at a node 23 to one terminal of the primary winding 11 of the transformer 13, with the primary winding's other terminal connected to a node 25 between two large storage capacitors 27 and 29. These capacitors are connected in series between positive and negative voltage supplies 31 and 33, respectively. These two capacitors are approximately equal in size, so that the voltage at the node 25 is approximately midway between the two supply voltages.

The two drive circuits 19 and 21 are controlled such that they turn on only one of the power transistors 15 and 17 at a time. The first transistor 15 is arranged with its emitter terminal connected to the negative voltage supply 33 and its collector terminal connected via the node 23 to the transformer's primary winding 11. The second transistor 17 is arranged with its emitter terminal connected via the node 23 to the transformer's primary winding and its collector terminal connected to the positive voltage supply 31. Thus, when the first transistor is turned on, electrical current is coupled through the primary winding in a first direction (i.e., right-to-left in FIG. 1), whereas, when the second transistor is turned on, electrical current is coupled through the winding in the opposite direction (i.e., left-to-right in FIG. 1).

The two transistors 15 and 17 are turned on and off, individually, at a relatively high rate, e.g., 20 kHz. For the first half cycle of the 60 Hz power signal being generated, the first transistor is turned on and off repeatedly, while the second transistor remains off. Similarly, for the second half cycle of the 60 Hz signal, the second transistor is turned on and off repeatedly, while the first transistor remains off. This process is repeated indefinitely. The successive transistor on-times are controllably adjusted, i.e., pulse-width modulated, such that, after filtering by a low-pass filter (not shown) connected to the secondary winding 35 of the transformer 13, a uniform 60 Hz power signal is produced. The two storage capacitors 27 and 29 are sized so that the successive charges and discharges of electrical current from the transformer's primary winding 11 do not significantly affect the voltage present at the node 25 between them.

Since the two power transistors 15 and 17 are coupled directly to the primary winding 11 of the transformer 13, the load presented to them is highly inductive. Thus, each time one of the transistors is switched off, the electrical current previously flowing through the primary winding continues to flow. To divert this current away from the transistor junction, and thus prevent damage to the transistor because of the simultaneous presence of high voltage and high current, the bridge circuit further includes first and second snubber capacitors 37 and 39 shunting the respective first and second transistors. The first snubber capacitor and a series diode 41 are connected between the negative voltage supply 33 and the node 23, and the second snubber capacitor and s series diode 43 are connected between that node and the positive voltage supply 31.

Thus, when the first transistor 15 is first switched off, electrical current flowing through the primary winding 11 is diverted through the diode 41 to charge the first snubber capacitor 37. This charging continues until the voltage on the capacitor's top plate is approximately equal to that of the positive voltage supply 31. Similarly, when the second transistor 17 is first switched off, electrical current flowing through the primary winding is diverted through the diode 43 to charge the second snubber capacitor 39. This charging continues until the voltage on the capacitor's lower plate is approximately equal to that of the negative voltage supply 33.

Each time one of the two power transistors 15 or 17 is again switched on, it is necessary to discharge the associated snubber capacitor 37 or 39 to its original uncharged state, so that it is properly initialized for the next time that same transistor is switched off. In the past, this has frequently been accomplished by shunting each diode 41 or 43 with a separate resistor, such that each snubber capacitor is discharged through the associated transistor, itself. This unfortunately dissipates substantial amounts of energy and can drastically affect the bridge circuit's efficiency. There has been a need for an improved means for discharging the snubber capacitors in power bridge circuits of this kind, that is substantially non-dissipative of energy.

In accordance with the invention, the halfbridge circuit further includes a separate non-dissipative discharge circuit for discharging each of the snubber capacitors 37 or 39. Each discharge circuit discharges its associated capacitor by directing electrical current back to the node 25 between the two large storage capacitors 27 and 29. The discharge circuit associated with the first transistor 15 and snubber capacitor 37 includes a series-connected diode 45, an inductor 47 and an npn switching transistor 49. Actuation of the switching transistor 49 at the appropriate time (i.e., after the power transistor 15 is first turned on), fully discharges the snubber capacitor 37. The voltage on the top plate of the capacitor 37 actually swings past the voltage at the node 25, substantially to the voltage of the negative supply 33. This occurs because the snubber capacitor 37 and inductor 47 form a substantially undamped tuned circuit, such that the voltage on the top plate of the capacitor swings as far below the node voltage as it started out above it. In the preferred embodiment, the snubber capacitor has a capacitance of 0.15 microfarads and the inductor has an inductance of 17 microhenries.

The switching transistor 49 is switched on for approximately as long a time duration as is required to fully discharge the snubber capacitor 37. This time duration corresponds approximately to one half the natural period of the snubber capacitor and the inductor 47. The switching transistor is switched on using a transformer 51 and an amplifier 53, under the control of the same Y drive circuit 19 that controls the associated first power transistor 15. The amplifier is preferably a high current gain amplifier such as an open-collector Darlington transistor, and the Y drive circuit controls it with a digital signal that is the complement of the signal it uses to control the associated power transistor 15. Thus, the amplifier is switched on only when the associated power transistor is switched off.

When the amplifier is switched off, its output terminal is an open circuit, whereas when it is switched on, its output terminal is held at a voltage of −6 volts. The amplifier's output terminal is connected via line 55 to one terminal of the transformer's primary winding 57, and a +6 volt reference voltage from the Y drive circuit 19 is connected via a current-limiting resistor 59 to the other terminal of the primary winding. Thus, when the amplifier 53 is switched on, electrical current is directed through the transformer's primary winding, building up to a maximum value determined substantially by the current-limiting resistor.

The secondary winding 61 of the transformer 51 is connected across the base-emitter junction of the switching transistor 49 and biases the transistor to its off state as long as the transformer's primary winding is being energized. When the amplifier 53 stops energizing the primary winding, however, the collapsing magnetic field in the transformer 51 biases the switching transistor 49 to its on state for the predetermined time duration required to fully discharge the associated snubber capacitor 37. Since this discharging commences immediately upon turn-on of the associated power transistor 15, the snubber capacitor is discharged in a minimum time duration. The transformer is sized such that the magnetic field collapses to the point where it can no longer forward bias the switching transistor 49 in approximately the same amount of time as is required to fully discharge the snubber capacitor 37.

Operation of the half-bridge circuit of FIG. 1 will now be reviewed with reference to the timing diagrams of FIG. 2. Each waveform in FIG. 2 represents the voltage or current present at the correspondingly-lettered location in the circuit of FIG. 1. In the figures, the zero voltage reference corresponds to the voltage of the negative voltage supply 33. FIG. 2A depicts the voltage level present at the base terminal of the power transistor 15. For the short time duration when this signal is at zero volts, the transistor is biased off, whereas at all other times it is biased on. With reference to FIG. 2B, it will be observed that the voltage on the top plate of the snubber capacitor 37 begins to rise immediately after the power transistor 15 is switched off, reaching a maximum level approximately equal to the voltage difference between the positive and negative supplies 31 and 33, e.g., 150 volts in the preferred embodiment. The voltages at the nodes C and D on either side of the inductor 47 follow this rising voltage on the snubber capacitor, as shown in FIGS. 2C and 2D. A diode 63 connected between the node D and the positive supply ensures that the voltage level at the nodes B, C and D cannot be driven significantly higher than that positive supply.

When the Y drive circuit 19 again switches the power transistor 15 on, and simultaneously switches the amplifier 53 off, the collapsing magnetic field in the transformer 51 biases the switching transistor 49 on, to discharge the snubber capacitor 37 through the diode 45, inductor 47 and transistor 49 to the node 25 between the two storage capacitors 27 and 29. The voltage levels on the capacitor 37 (FIG. 2B) and the input terminal of the inductor 47 (FIG. 2C) therefore begin to drop smoothly toward ground at this time. The resulting discharge current, which is depicted in FIG. 2F, rises smoothly to a maximum value of about 8 amperes and then falls back to zero, with the current waveform approximating one half period of a natural oscillation of the snubber capacitor 37 and inductor 47.

As soon as the voltage on the snubber capacitor 37 reaches zero, it is in condition to once again receive a charging current from the primary winding 11 of power transformer 13 when the associated power transistor is again switched off. By fully discharging the snubber capacitor in the rapid fashion described above, thereby providing a minimum recovery time, the Y drive circuit 19 can turn the transistor on and off at a very high rate. This permits the maximum flexibility in shaping the 60 Hz power signal produced by the power transformer 13.

As shown in FIG. 2F, the electrical current discharged from the snubber capacitor 37 reverses direction slightly after the capacitor has been discharged. This is caused by the reverse recovery characteristic of diode 45 arranged in series with inductor 47. This current reversal is limited in amplitude by means of a series-connected resistor 65 and capacitor 67 shunting the inductor. In the preferred embodiment, the resistor has a resistance of 100 ohms and the capacitor has a capacitance of 0.001 microfarads.

With reference again to FIG. 1, the second switching power transistor 17 and associated snubber capacitor 39 have associated with them the same kind of discharge circuitry as that described above for the first power transistor 15 and its associated snubber capacitor 37. In particular, the snubber capacitor 39 is discharged through a series-connected diode 69, inductor 71 and switching npn transistor 73. This latter transistor is controllably biased on and off by a transformer 75 and amplifier 77, under the control of the W drive circuit 21. The amplifier is connected via line 79 to one terminal of the transformer's primary winding and a ≠volt reference voltage is connected via a current-limiting resistor 81 to the other terminal of the winding. The transformer's magnetic field collapses, to bias the switching transistor on and discharge the snubber capacitor each time the W drive circuit 21 biases the power transistor 17 on. As is the case with the discharge circuit for the first snubber capacitor 37, this second discharge circuit further includes a series-connected capacitor 83 and resistor 85 shunting the inductor 71, along with a protective diode 87 connected between the inductor's input terminal and the positive voltage supply 31.

With reference now to FIG. 3, there is shown an alternative embodiment of the invention, in which two of the same discharge circuits as found in FIG. 1 are included in a full power bridge configuration. This full-bridge configuration functions in much the same way as the half-bridge configuration of FIG. 1, to produce a 60 Hz power signal by controllably directing current pulses through the primary winding 11 of the power transformer 13. In both embodiments, corresponding elements are identified by the same reference numerals. The primary difference between the full power bridge of FIG. 3 and the half power bridge of FIG. 1 is that the two large storage capacitors 27 and 29 of FIG. 1 are replaced by third and fourth switching power transistors 89 and 91, respectively, and associated third and fourth snubber capacitors 93 and 95, respectively.

More particularly, the third power transistor 89 is connected between the positive voltage supply 31 and the far terminal 25 of the power transformer's primary winding 11, and the fourth transistor 91 is connected between that same primary winding terminal and the negative voltage supply 33. An X drive circuit 97 biases on the third transistor at the same time as the Y drive circuit 19 biases on the first transistor 15, so that the two transistors cooperate to couple electrical current through the primary winding in the right-to-left direction. Similarly, a Z drive circuit 99 biases on the fourth transistor 91 at the same time as the W drive circuit 21 biases on the second transistor 17, so that the two transistors cooperate to couple electrical current through the primary winding in the left-to-right direction. In this full-bridge configuration, approximately twice the voltage is applied to the primary winding as is applied in the half-bridge configuration.

To prevent damage to the third and fourth transistors 89 and 91, respectively, when they are first turned off, they are shunted by the third and fourth snubber capacitors 93 and 95, respectively. In particular, the third snubber capacitor and a series diode 101 shunt the third transistor, and the fourth capacitor and a series diode 103 shunt the fourth transistor. Thus, when the third transistor is first switched off, the electrical current that it previously supplied to the transformer's primary winding 11 is supplied by the third snubber capacitor 93 via the diode 101. The bottom plate of this capacitor is thereby charged to approximately the voltage of the negative supply 33. Similarly, when the fourth transistor is first switched off, the electrical current that is previously pulled through the transformer's primary winding is diverted through the diode 103 to charge the fourth snubber capacitor. The top plate of this capacitor is thereby charged to approximately the voltage of the positive supply 31.

When either of the third and fourth transistors 89 and 91 is again switched on, it is necessary to re-initialize the associated snubber capacitor 93 or 95 by discharging it to its fully discharged state. This is accomplished using the same two discharge circuits as are used to discharge the first and second snubber capacitors 37 and 39, respectively.

In particular, the first and third snubber capacitors 37 and 93, respectively, are discharged simultaneously by the first discharge circuit, which includes the diode 45, the inductor 47 and the switching transistor 49. This simultaneous discharging is accomplished by simply connecting the emitter terminal of the switching transistor 49 directly to the node between the third snubber capacitor 93 and its associated diode 101. Thus, when the switching transistor is biased on by the transformer 51, discharge current is channeled from the first snubber capacitor 37 through the diode 45, inductor 47 and transistor 49 to the third snubber capacitor 93. By making the first and third capacitors have substantially equal capacitance values, interconnecting the two in this fashion, discharges both of them substantially to their uncharged states. In this embodiment, the transformer 51 is sized to bias on the switching transistor 49 for a duration roughly equal to one half the natural period of the inductor 47 and the two snubber capacitors 37 and 93, together.

A similar discharging of the second and fourth snubber capacitors 39 and 95, respectively, is accomplished using the second discharge circuit, which includes the diode 69, the inductor 71 and the switching transistor 73. In particular, the anode terminal of the diode 69 is simply connected directly to the node between the fourth snubber capacitor 95 and its associated diode 103. Thus, when the switching transistor 73 is biased on by the transformer 75, discharge current flows from the fourth snubber capacitor 95 through the diode 69, inductor 71 and transistor 73 to the second snubber capacitor 39. By making the second and fourth capacitors have substantially equal capacitance values, the two are fully discharged at the same time.

It should be appreciated from the foregoing description that the present invention provides an improved snubber circuit for particular use in both half power bridge and full power bridge circuit configurations. The snubber circuit prevents damage to various switching power transistors driving an inductive load when those transistors are first turned off, yet is substantially non-dissipative of energy. In addition, the snubber circuit has an extremely low recovery time, so that the transistors can be controllably switched on and off at a high frequency, thereby permitting maximum flexibility in the creation of an ac power signal.

Although the present invention has been described in detail with reference to the presentlypreferred embodiments, it will be appreciated by those of ordinary skill in the art that various modifications can be made without departing from the invention. Accordingly, the invention is limited only by the following claims.

I claim:

1. In a power bridge circuit of the kind including first, second, third and fourth switching power transistors connected to an inductive load, the first and third transistors being connected to opposite sides of the load and arranged to couple an electrical current through the load in a first direction, and the second and fourth transistors likewise being connected to opposite sides of the load and arranged to couple an electrical current through the load in a second, opposite direction, the circuit further including driver means for controllably biasing on the first and third transistors at substantially the same times and the second and fourth transistors at substantially the same times not coincident with the times the first and third transistors are biased on, and first, second, third and fourth capacitors shunting the respective first, second, third and fourth transistors, such that when the driver means biases off each corresponding pair of transistors, electrical current flowing through the inductive load is diverted through the associated pair of capacitors, to charge the capacitors to predetermined voltages, an improvement comprising:

first non-dissipative discharge means interconnecting the first and third capacitors, and second non-dissipative discharge means interconnecting the second and fourth capacitors, each of the first and second discharge means discharging its two associated capacitors simultaneously to their original states when the driver means again biases on the associated transistors, each of the first and second discharge means including an inductor, switch means connected in series with the inductor, and actuation means for controllably actuating the switch means when the associated transistors are biased on, to simultaneously discharge the two associated capacitors through the inductor.

2. A power bridge circuit for driving an inductive load, comprising:

first and second switching power transistors connected to the same inductive load, the first transistor being arranged to couple an electrical current through the inductive load in a first direction and the second transistor being arranged to couple an electrical current through the inductive load in a second, opposite direction;

driver means for controllably switching on the first and second transistors at independent, non-simultaneous times;

first and second snubber capacitors shunting the respective first and second transistors, such that when either transistor is switched off by the driver means, electrical current flowing through the inductive load is diverted through the associated capacitor, to charge the capacitor to a predetermined voltage; and first and second non-dissipative discharge means associated with the respective first and second snubber capacitors, each discharge means for discharging the associated capacitor to its original state when the associated transistor is again switched on by the driver means, and each discharge means including an inductor switch means connected in series with the inductor, a transformer having a plurality winding and a secondary winding, the secondary winding being connected to the switch means, and means for coupling a predetermined drive signal to the primary winding of the transformer only when the associated power transistor is switched off by the driver means, such that when the power transistor is again switched on and the drive signal therefore uncoupled from the primary winding, the magnetic field stored in the transformer collapses, to actuate the switch means, the transformer being sized such that the switch means is actuated for a duration corresponding to about one-half the natural period of the associated inductor and snubber capacitor, such that the switch means discharges the capacitor through the inductor.

3. A power bridge circuit as defined in claim 2, wherein:

the circuit is a half bridge, with the side of the inductive load opposite the first and second transistors being held at a substantially constant voltage; and the first and second discharge means both connect their respective associated snubber capacitors to the side of the inductive load opposite the first and second transistors.

4. A power bridge circuit as defined in claim 2, wherein:

the circuit is a full bridge and further includes third and fourth switching power transistors connected to the side of the inductive load opposite the first and second transistors, the third transistor being arranged to cooperate with the first transistor in coupling electrical current through the load in the first direction, and the fourth transistor being arranged to cooperate with the second transistor in coupling electrical current through the load in the second direction;

the driver means controllably switches on and off the first and third transistors at substantially the same times and the second and fourth transistors at substantially the same times;

the circuit further includes third and fourth snubber capacitors shunting the respective third and fourth transistors, such that when each transistor is switched off by the driver means, electrical current flowing through the inductive load is diverted through the associated capacitor, to charge the capacitor to a predetermined voltage;

the first discharge means interconnects the first and third capacitors, to simultaneously discharge both of them to their original states when the first and third transistors are again switched on by the driver means; and the second discharge means interconnects the second and fourth capacitors, to simultaneously discharge both of them to their original states when the second and fourth transistors are again switched on by the driver means.

5. A power bridge circuit as defined in claim 4 wherein:

the first and third snubber capacitors have substantially equal capacitance values; and the second and fourth snubber capacitors have substantially equal capacitance values.

6. A power bridge circuit for driving an inductive load, comprising:

first, second, third and fourth switching power transistors connected to an inductive load, the first and third transistors being connected to opposite sides of the load and arranged to couple an electrical current through the load in a first direction, and the second and fourth transistors likewise being connected to opposite sides of the load and arranged to couple an electrical current through the load in a second, opposite direction;

driver means for controllably biasing on the first and third transistors at substantially the same times and the second and fourth transistors at substantially the same times not coincident with the times the first and third transistors are biased on;

first, second, third and fourth capacitors shunting the respective first, second, third and fourth transistors, such that when the driver means biases off each corresponding pair of transistors, electrical current flowing through the inductive load is diverted through the associated pair of capacitors, to charge the capacitors to predetermined voltages; and first non-dissipative discharge means interconnecting the first and third capacitors, and second non-dissipative discharge means interconnecting the second and fourth capacitors, each of the first and second discharge means discharging its two associated capacitors simultaneously to their original states when the driver means again biases on the associated transistors, each of the first and second discharge means including an inductor, switch means connected in series with the inductor, and actuation means for controllably actuating the switch means when the associated transistors are biased on, to simultaneously discharge the two associated capacitors through the inductor.

7. A power bridge circuit as defined in claim 6, wherein:

the first and third capacitors have substantially equal capacitance values; and the second and fourth capacitors have substantially equal capacitance values.

8. A power bridge circuit as defined in claim 6, wherein each discharge means further includes a series-connected resistor and capacitor shunting the inductor, for reducing the amplitude of any oscillating voltage across the inductor immediately after the actuation means stops actuating the switch means.

9. A power bridge circuit as defined in claim 6, wherein the actuation means included in each of the first and second discharge means includes:

a transformer having a primary winding and a secondary winding, the secondary winding being connected to the switch means; and means for coupling a predetermined drive signal to the primary winding of the transformer only when the associated power transistor is switched off by the driver means, such that when the power transistor is again switched on and the drive signal therefore uncoupled from the primary winding, the magnetic field stored in the transformer collapses, to actuate the switch means for a predetermined time duration.

10. A power bridge circuit as defined in claim 6, wherein the actuation means included in each of the first and second discharge means controllably actuates the associated switch means for a duration corresponding to about one-half the natural period of the associated inductor and capacitor.

11. An improvement as defined in claim 1, wherein:

the first and third capacitors have substantially equal capacitance values; and the second and fourth capacitors have substantially equal capacitance values.

12. An improvement as defined in claim 1, wherein each discharge means further includes a seriesconnected resistor and capacitor shunting the inductor, for reducing the amplitude of any oscillating voltage across the inductor immediately after the actuation means stops actuating the switch means.

13. An improvement as defined in claim 1, wherein the actuation means included in each of the first and second discharge means includes:

a transformer having a primary winding and a secondary winding, the secondary winding being connected to the switch means; and means for coupling a predetermined drive signal to the primary winding of the transformer only when the associated power transistor is switched off by the driver means, such that when the power transistor is again switched on and the drive signal therefore uncoupled from the primary winding, the magnetic field stored in the transformer collapses, to actuate the switch means for a predetermined time duration.

14. An improvement as defined in claim 1, wherein the actuation means included in each of the first and second discharge means controllably actuates the associated switch means for a duration corresponding to about one-half the natural period of the associated inductor and capacitor.

* * * * *